(12) United States Patent
Wakabayashi et al.

(10) Patent No.: US 7,221,157 B2
(45) Date of Patent: May 22, 2007

(54) MAGNETIC SENSOR APPARATUS AND MANUFACTURING METHOD THEREOF

(75) Inventors: Shinji Wakabayashi, Anjo (JP); Satoshi Oohira, Ichinomiya (JP); Takashi Kawashima, Nagoya (JP)

(73) Assignee: DENSO Corporation (JP)

( * ) Notice: Subject to any disclaimer, the term of this patent is extended or adjusted under 35 U.S.C. 154(b) by 229 days.

(21) Appl. No.: 11/050,672

(22) Filed: Feb. 7, 2005

(65) Prior Publication Data

US 2005/0174112 A1    Aug. 11, 2005

(30) Foreign Application Priority Data

Feb. 6, 2004    (JP)    ............... 2004-031243

(51) Int. Cl.
*G01R 33/07* (2006.01)
*H01L 43/06* (2006.01)
*G01B 7/14* (2006.01)
*G01B 7/30* (2006.01)

(52) U.S. Cl. .................... 324/251; 324/207.2

(58) Field of Classification Search ........... 324/207.2, 324/207.21–207.25, 249, 251, 252; 257/421–427; 438/3; 338/32 R, 32 H
See application file for complete search history.

(56) References Cited

U.S. PATENT DOCUMENTS

| | | | | |
|---|---|---|---|---|
| 5,446,307 A | * | 8/1995 | Lux et al. | .................... 257/423 |
| 6,169,254 B1 | * | 1/2001 | Pant et al. | .................... 174/254 |
| 2004/0103530 A1 | * | 6/2004 | Adachi et al. | .................... 29/854 |

FOREIGN PATENT DOCUMENTS

| | | | |
|---|---|---|---|
| JP | 4302406 | * | 10/1992 |
| JP | 05-291482 | * | 5/1993 |
| JP | 9257511 | * | 10/1997 |
| JP | 2002-156204 | * | 11/2000 |

OTHER PUBLICATIONS

S. Kawahito et al., Micromachined Hall Elements for Two-Dimensional Magnetic-Field Sensing, 1994, Sensor and Actuators A40 Feb. 1994, No. 2, all pages.*
S. Kawahito et al., "MOS Hall Elements with Three-Dimensional Micorstructure", Transducers 93', The 7th International Conference on Solid-State Sensors and Actuators, pp. 892-895, 1993.
Y. Watanabe et al., "3-Axis Sensor Fagbricated by Microassembly Technique", IEEE Japan, Transactions on Sensors and Micromachines, vol. 122-E, No. 4, pp. 212-215, 2002.

* cited by examiner

*Primary Examiner*—Edward Lefkowitz
*Assistant Examiner*—Kenneth J. Whittington
(74) *Attorney, Agent, or Firm*—Nixon & Vanderhye PC

(57) ABSTRACT

Two Hall element forming arrangements are formed on a semiconductor substrate. Each Hall element forming arrangement includes a Hall element that is formed in a principal surface of the semiconductor substrate. A base is formed separately from the semiconductor substrate. Then, the base is disposed at a rear surface of the semiconductor substrate and holds the semiconductor substrate and the Hall element forming arrangements. The base includes a holding surface, which holds the semiconductor substrate, and two slant surfaces, each of which is slanted relative to the holding surface. Each Hall element forming arrangement is held on a corresponding one of the at least one slant surface of the base.

19 Claims, 14 Drawing Sheets

MAGNETIC SENSOR APPARATUS AND MANUFACTURING METHOD THEREOF

CROSS REFERENCE TO RELATED APPLICATION

This application is based on and incorporates herein by reference Japanese Patent Application No. 2004-31243 filed on Feb. 6, 2004.

BACKGROUND OF THE INVENTION

1. Field of the Invention

The present invention relates to a magnetic sensor apparatus having a Hall element disposed on a slant surface and a manufacturing method for the magnetic sensor apparatus.

2. Description of Related Art

A magnetic sensor apparatus having a Hall element disposed on a slant surface and a manufacturing method for the magnetic sensor apparatus are disclosed, for example, in pages 892 to 895 of "Transducers 93', 1993 The 7th International Conference on Solid-State Sensors and Actuators" (Hereinafter, referred to as "Document 1").

FIGS. 15A and 15B are schematic diagrams of the magnetic sensor apparatus 90 disclosed in the Document 1. FIG. 15A is a top view of the magnetic sensor apparatus 90, and FIG. 15B is a sectional view taken along line XVB-XVB in FIG. 15A.

The magnetic sensor apparatus 90 illustrated in FIGS. 15A and 15B has two Hall elements 2a and 2b. In the magnetic sensor apparatus 90, a deep recess it is formed by wet etching on a p-type silicon substrate 1, which has the {100} plane direction. The recess it is substantially square in its planer view and about 100 µm in depth. N-type low-concentration impurity diffusion regions 2a and 2b, which serve as the Hall elements, are formed on two slant surfaces of the silicon substrate 1, which have the {111} plane direction and are opposed to each other in the recess 1t. An n-type high-concentration impurity diffusion region 4 is formed as an electrode wiring connected to the Hall elements 2a and 2b. The section marked with numeral 3p in FIG. 15B is a polysilicon layer, which is a gate electrode used in the case where the low-concentration impurity diffusion regions (the Hall elements) 2a and 2b are used as transistors. In FIG. 15A, the graphic representation of the polysilicon layer 3p is omitted for the sake of simplicity, and only gate electrode wirings (electrical lines) Ga and Gb are shown.

With reference to FIG. 15B, in the magnetic sensor apparatus 90, when a magnetic field Bo, which is directed parallel to the plane of the XVB-XVB section of FIG. 15A, is applied, magnetic field components Ba and Bb, which are directed perpendicular to the slant surfaces, respectively, are applied to the respective Hall elements 2a and 2b. In the Hall elements 2a and 2b, through which bias currents Ia and Ib are passed, the voltages, which are proportional to the magnetic field components Ba and Bb (Hall voltages), are produced. The Hall voltages are detected as output voltages Va and Vb. Thus, for example, the rotational angle of the magnetic field Bo, which rotates in the plane of the XVB-XVB section, can be detected based on the output voltages Va and Vb and the two signals, which are different in phase, throughout the 360 degree range. Therefore, the magnetic sensor apparatus 90 can be used as a rotational angle sensor.

Another magnetic sensor apparatus having a Hall element disposed perpendicularly to the substrate face and a manufacturing method for the magnetic sensor apparatus are disclosed in pages 212 to 215 of IEEJ Transactions on Sensors and Micromachines, Vol. 122, No. 4 (2002) (Hereinafter, referred to as "Document 2").

FIG. 16 is a schematic sectional view of the magnetic sensor apparatus 91 disclosed in the Document 2.

In the magnetic sensor apparatus 91 illustrated in FIG. 16, two silicon substrates 1a and 1b are used. The Hall element 2c of the magnetic sensor apparatus 91 is formed over a n-type silicon substrate 1a. A recess 1as is formed in the silicon substrate 1a around the Hall element 2c. The Hall element forming arrangement 2ck, which includes the Hall element 2c, is provided by the following procedure. That is, a metal layer 6 and a resin layer 7 laminated over the silicon substrate 1a are bent at the junction B, encircled with an alternate long and short dash line in FIG. 16. The metal layer 6 and the resin layer 7 are then folded upward. Another silicon substrate 1b is joined to the silicon substrate 1a in proximity to the Hall element forming arrangement 2ck at the bonding portion C encircled with an alternate long and short dash line in the figure. The Hall element forming arrangement 2ck is bonded to the perpendicular wall face 1bw provided by the silicon substrate 1b, and held there. The metal layer 6 is composed of a laminate of chromium (Cr)/gold (Au), and the resin layer 7 is composed of polyimide. The area marked with numeral 5 in FIG. 16 is a dielectric insulating layer.

With respect to the magnetic sensor apparatus 90 in FIGS. 15A and 15B, patterning of a resist is required for forming the low-concentration impurity diffusion regions 2a and 2b as the Hall elements and the high-concentration impurity diffusion region 4 as the electrode wiring. However, there are disadvantages. Specifically, the diffusion regions 2a, 2b, and 4 are formed across the slant surfaces of the recess 1t that is as deep as 100 µm or so. Therefore, an electron beam (EB) lithography technology in which a large focal range is obtained must be used. Even when an electron beam large in focal range is used, the single exposure is insufficient, and electron beam exposure must be carried out in four stages at different focal depths. For this reason, this method for the manufacture of the magnetic sensor apparatus 90 requires much processing time and gives poor throughput (several pieces/hour). Thus, this method is unsuitable for mass production.

The magnetic sensor apparatus 91 in FIG. 16 has another disadvantage. The silicon substrate 1b is protruded upward from the silicon substrate 1a at the bonding portion C in the figure, and this increases the size of the magnetic sensor apparatus 91 itself. In processing the perpendicular wall face 1bw of the silicon substrate 1b, cutting by dicing and planarization by thermal oxidation after the dicing and oxide layer removal are used. However, thermal oxidation and planarization by oxide layer removal must be repeatedly carried out, and this increases processing time. In dicing, an error is prone to be produced in the formation angle of the wall face 1bw. When there is an error in the formation angle of the wall face 1bw, information obtained from the Hall element 2c also has an error.

SUMMARY OF THE INVENTION

The present invention addresses the above disadvantages. Thus, it is an objective of the present invention to provide a magnetic sensor apparatus, which has at least one Hall element each disposed on a corresponding slant surface, and which is suitable for mass production while achieving relatively high accuracy. It is another objective of the present invention to provide a manufacturing method of such a magnetic sensor apparatus.

To achieve the objectives of the present invention, there is provided a magnetic sensor apparatus, which includes a semiconductor substrate, at least one Hall element forming arrangement and a base. The at least one Hall element forming arrangement is formed on the semiconductor substrate. Each of the at least one Hall element forming arrangement includes a Hall element that is formed in a principal surface of the semiconductor substrate. The base is disposed at a rear surface of the semiconductor substrate and holds the semiconductor substrate and the at least one Hall element forming arrangement. The base includes a holding surface and at least one slant surface. The holding surface holds the semiconductor substrate. The at least one slant surface is slanted relative to the holding surface. Each of the at least one Hall element forming arrangement is held on a corresponding one of the at least one slant surface of the base.

To achieve the objectives of the present invention, there is also provided a manufacturing method for a magnetic sensor apparatus. According to the method, at least one Hall element forming arrangement is prepared on a semiconductor substrate. Each of the at least one Hall element forming arrangement includes a Hall element that is formed in a principal surface of the semiconductor substrate. Then, a base for holding the semiconductor substrate is prepared. The base includes a holding surface and at least one slant surface. The holding surface holds the semiconductor substrate. At least one slant surface is slanted relative to the holding surface. Thereafter, the semiconductor substrate is held on the base upon disposing the base at a rear surface of the semiconductor substrate, so that each of the at least one Hall element forming arrangement is held on a corresponding one of the at least one slant surface of the base.

BRIEF DESCRIPTION OF THE DRAWINGS

The invention, together with additional objectives, features and advantages thereof, will be best understood from the following description, the appended claims and the accompanying drawings in which:

DETAILED DESCRIPTION OF THE INVENTION

Figure 1A:
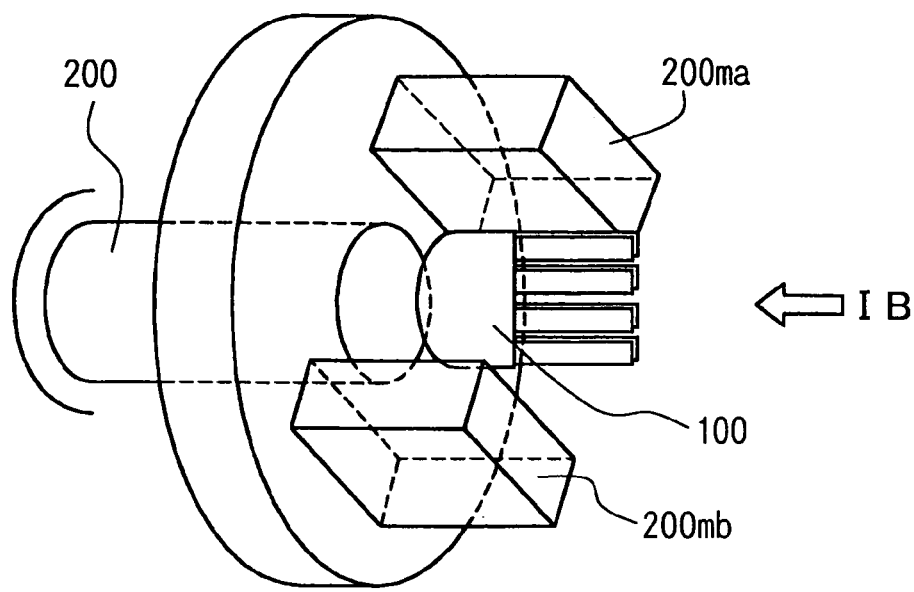
FIG. 1A is a perspective view illustrating an overall construction of a magnetic sensor apparatus and a rotatable body according to an embodiment of the present invention.
Figure 1B:
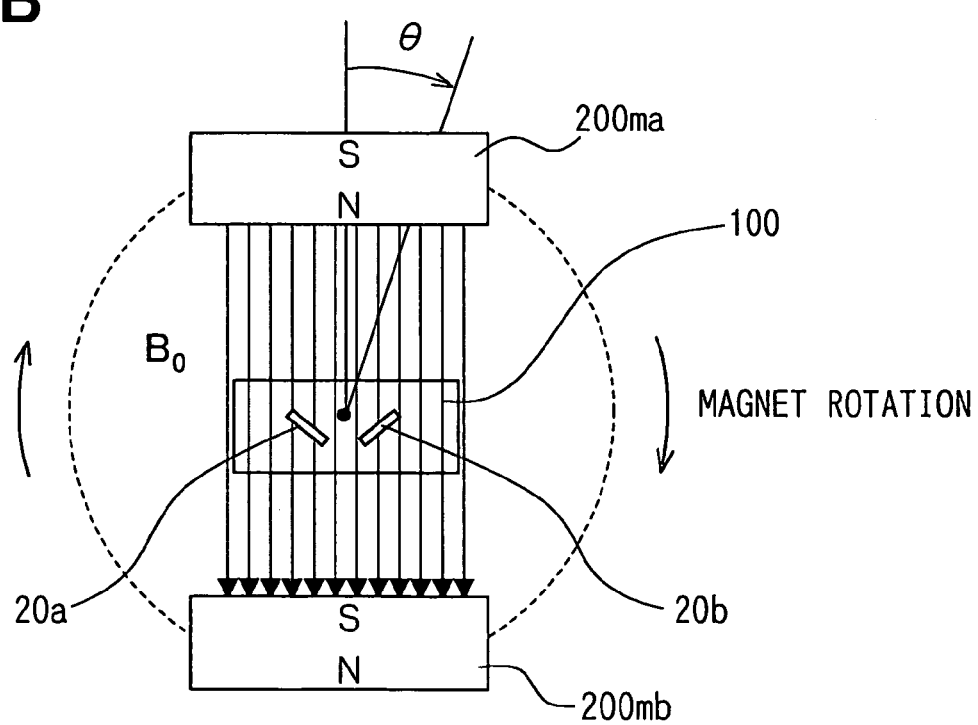
FIG. 1B is an end view seen in a direction of an arrow IB in FIG. 1A.

FIGS. 1A and 1B schematically illustrate a magnetic sensor apparatus 100 used as a rotational angle sensor according an embodiment of the present invention. More specifically, FIG. 1A is a perspective view showing the overall construction of the magnetic sensor apparatus 100 and a rotatable body 200 to be detected by the magnetic sensor apparatus 100. FIG. 1B is a drawing showing them as viewed from the direction of the arrow IB in FIG. 1A, illustrating the relation between the magnetic sensor apparatus 100 and an applied magnetic field.

Figure 15A:
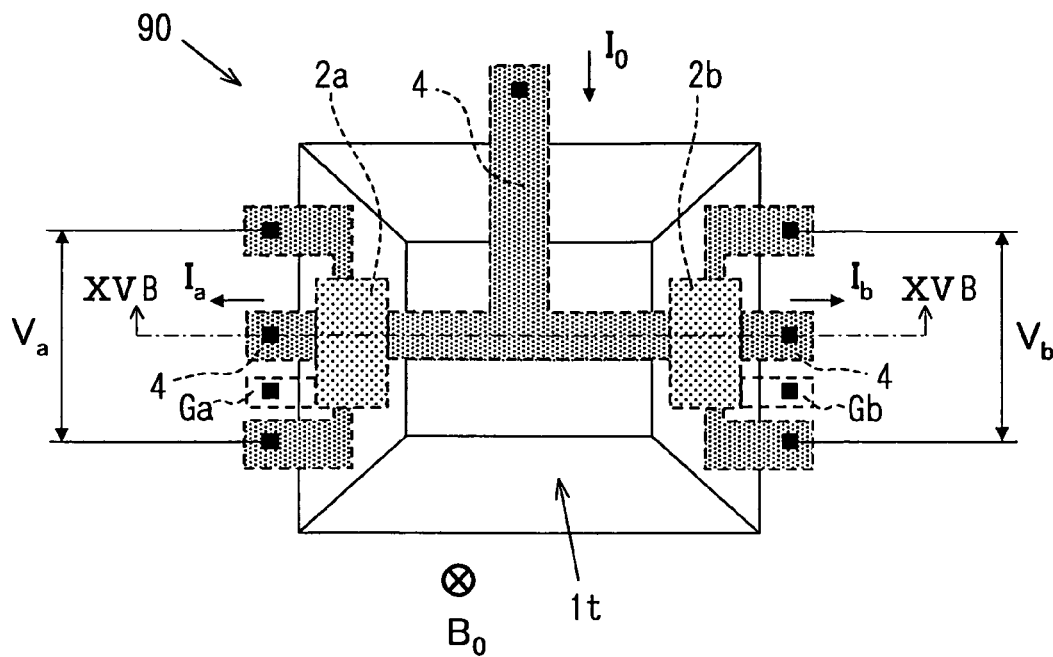
FIG. 15A is a schematic top view of a conventional magnetic sensor apparatus.
Figure 15B:
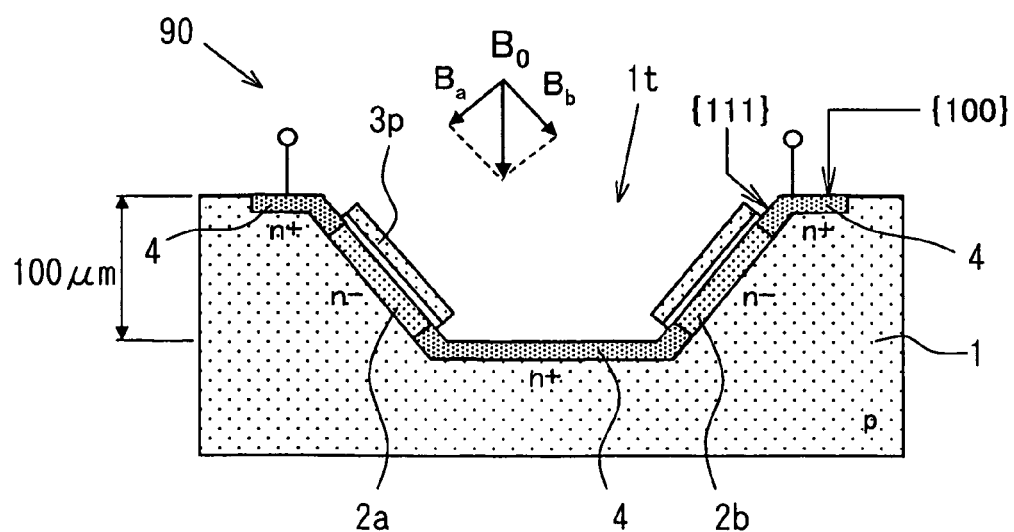
FIG. 15B is a cross sectional view taken along line XVB-XVB in FIG. 15A.

In the case where the magnetic sensor apparatus 100 is used as a rotational angle sensor, as illustrated in FIG. 1A, two magnets 200*ma* and 200*mb*, which are rotated together with the rotatable body 200, are provided. In the magnetic sensor apparatus 100, which is received between the two rotating magnets 200*ma* and 200*mb*, a uniform rotating magnetic field Bo is applied as illustrated in FIG. 1B. Therefore, similar to the magnetic sensor apparatus 90 illustrated in FIGS. 15A and 15B, in the magnetic sensor apparatus 100, which have Hall elements 20*a* and 20*b* disposed on different slant surfaces, magnetic field components Ba and Bb (not shown), which are perpendicular to the slant surfaces, respectively, are applied to the Hall elements 20*a* and 20*b*, respectively.

Figure 2:
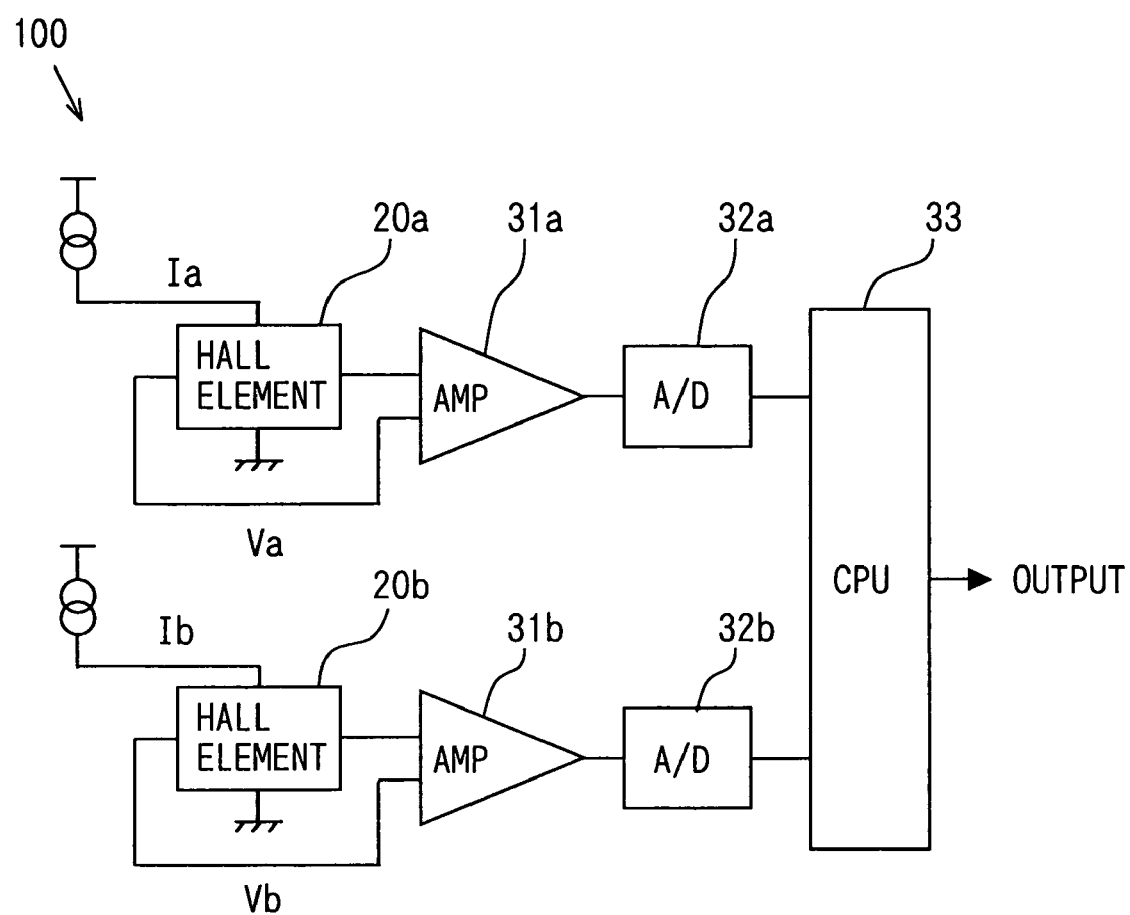
FIG. 2 is a diagram illustrating a signal processing circuit of the magnetic sensor apparatus.

FIG. 2 shows a signal processing circuit for processing signals, which are outputted from the two Hall elements 20*a* and 20*b* in the magnetic sensor apparatus 100.

Bias currents Ia and Ib are passed through the Hall elements 20*a* and 20*b*. In each Hall element 20*a*, 20*b*, the voltage Va, Vb, which is proportional to the magnetic field component Ba, Bb (Hall voltages), is produced. The Hall voltages Va and Vb are amplified through amplifiers 31*a* and 31*b* and are converted from analog to digital through A/D converters 32*a*, 32*b*. Then, the converted digital signals are supplied from the A/D converters 32*a* and 32*b* to a CPU 33. In the CPU 33, a rotational angle of the rotatable body 200 is computed based on the supplied digital signals.

Figure 3A:
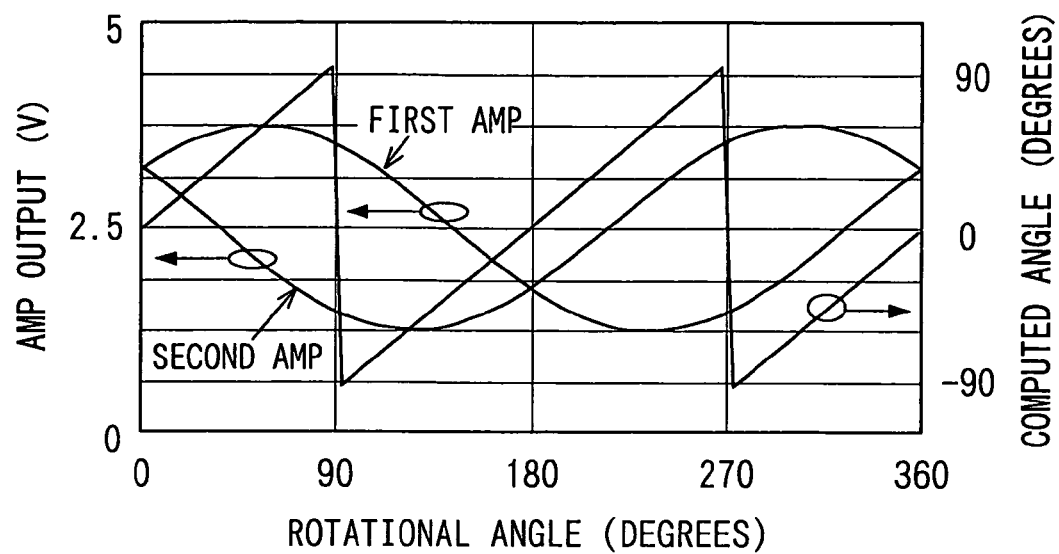
FIG. 3A is a diagram illustrating a relationship between a rotational angle and an amplifier output or a computed angle in the magnetic sensor apparatus of FIG. 2.

FIG. 3A illustrates a relationship between the output signals of the amplifiers 31*a* and 31*b* of FIG. 2 and the actual rotational angle θ. FIG. 3A further illustrates a relationship between the computed angle of the rotatable body 200, which is computed in the CPU 33 of FIG. 2, and the actual rotational angle. The output signals of the amplifiers 31*a* and 31*b*, which are obtained based on the rotating magnetic field Bo, become two sinusoidal signals, which have different phases, as illustrated in FIG. 3A. The result of the angle computation in FIG. 3A is obtained by subjecting the sinusoidal signals of the amplifiers 31*a* and 31*b* to computation using an inverse trigonometric function.

Figure 3B:
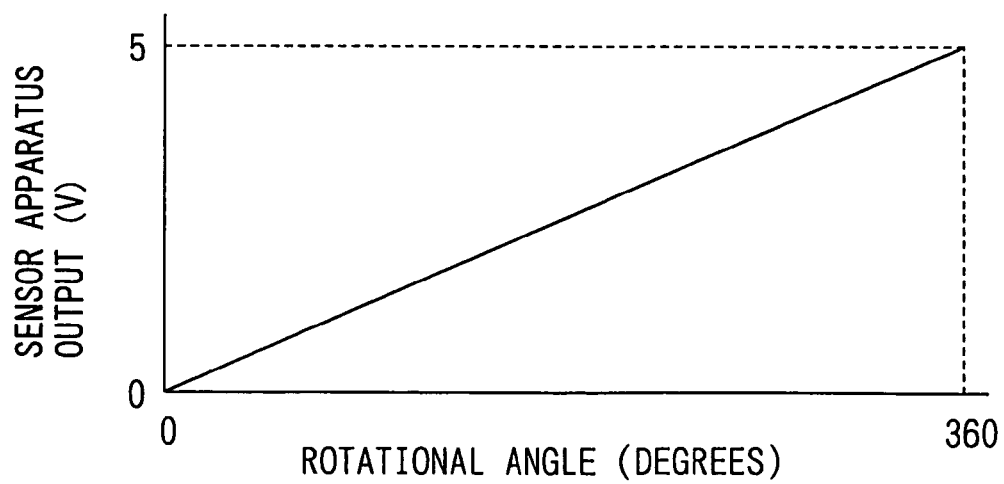
FIG. 3B is a diagram illustrating a relationship between the rotational angle and an output of the magnetic sensor apparatus.

FIG. 3B illustrates a relationship between the output of the magnetic sensor apparatus and the actual rotational angle. The output of the magnetic sensor apparatus is provided through the following process. That is, an angle domain is determined from the state of the output of the amplifiers 31*a* and 31*b*, and the results of angle computation are joined together from 0 to 360 degrees. Thus, the output of the magnetic sensor apparatus becomes linear with respect to the rotational angle, as illustrated in FIG. 3B.

Figure 4:
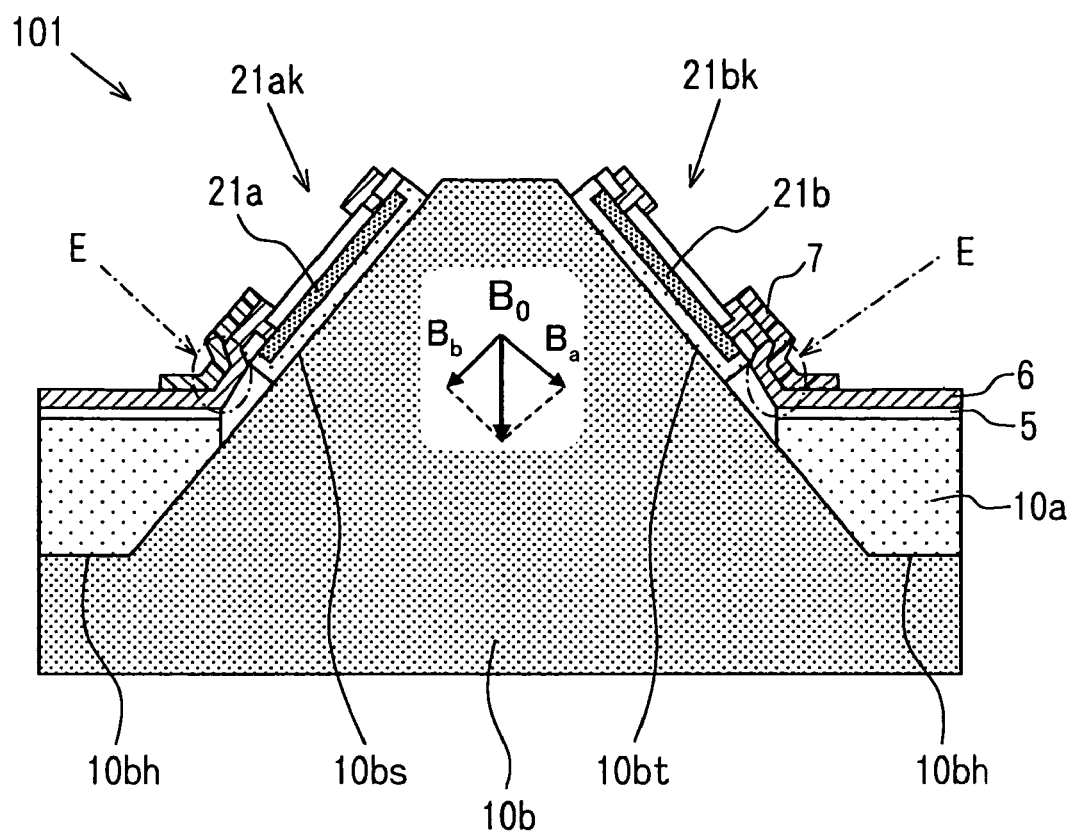
FIG. 4 is a schematic sectional view illustrating an example of the magnetic sensor apparatus.

FIG. 4 shows an exemplary magnetic sensor apparatus 101, which can be used as the magnetic sensor apparatus 100 of FIGS. 1A-2.

The magnetic sensor apparatus 101 of FIG. 4 includes two Hall element forming arrangements 21*ak* and 21*bk* and a base 10*b*. Each of the Hall element forming arrangements 21*ak* and 21*bk* includes a Hall element 21*a* or 21*b*, which is disposed in a principal surface of a semiconductor substrate 10*a*. The base 10*b* is disposed at a rear surface of the semiconductor substrate 10*a* and holds the semiconductor substrate 10*a* and the Hall element forming arrangements 21*ak* and 21*bk*. The semiconductor substrate 10*a*, in which the Hall elements 21*a* and 21*b* are formed, is formed separately from the base 10*b*, over which the Hall elements 21*a* and 21*b* are disposed. For this reason, the Hall elements 21*a* and 21*b* can be formed in the flat semiconductor substrate 10*a* in the beginning of the manufacturing process, as described later. In this manufacturing process, photolithography technology, which is generally used in the manufacture of semiconductor devices, can be used. Therefore, the magnetic sensor apparatus 101 of FIG. 4 is suitable for mass production in comparison to the magnetic sensor apparatus 90 of FIGS. 15A and 15B.

A p-type or n-type silicon (Si) substrate can be used for the semiconductor substrate 10*a* in the magnetic sensor apparatus 101. The Hall elements 21*a* and 21*b* can be formed in a manner similar to that of the magnetic sensor apparatus 90 shown in FIGS. 15A and 15B. That is, the Hall elements 21*a* and 21*b* can be formed by implanting impurity ions (having a conductivity type, which is opposite to that of the semiconductor substrate 10*a*) in the semiconductor substrate 10 at a low concentration. As mentioned above, the Hall elements 21*a* and 21*b* are formed in the flat semiconductor substrate 10*a* in the beginning. For this reason, unlike the magnetic sensor apparatus 90 shown in FIGS. 15A and 15B, each electrode wiring (electrical line), which is connected to the corresponding Hall element 21*a* or 21*b*, is formed of a metal layer 6 that is provided with an intermediate dielectric insulating layer 5 therebelow.

In the magnetic sensor apparatus 101, the base 10*b* has two slant surfaces 10*bs* and 10*bt*. The slant surfaces 10*bs* and 10*bt* are slanted relative to holding surfaces 10*bh*, which hold the semiconductor substrate 10*a*. The slant surfaces 10*bs* and 10*bt* have different plane directions, respectively. The base 10*b* can be formed of any suitable material. However, the base 10*b* is preferably made of a semiconductor substrate, which can be processed to form the slant surfaces 10*bs* and 10*bt* by generally available conventional processing techniques used in the manufacturing of semiconductor devices. Especially, when a single-crystal silicon substrate is used for the base 10*b*, the slant surfaces 10*bs* and 10*bt* having specified exact angles can be easily formed. At this time, crystal faces of the single-crystal silicon substrate that are preferentially formed by anisotropic etching may be used to form the slant surfaces 10*bs* and 10*bt*. Thus, the magnetic sensor apparatus 101 can be made as a highly accurate magnetic sensor apparatus that is less prone to generate errors.

In the magnetic sensor apparatus 101 of FIG. 4, as will be described in greater detail below, a recess (more clearly indicated by numeral 10*au* in FIG. 7B and numeral 10*av* in FIG. 7C) is formed in the rear surface of the semiconductor substrate 10*a* around the Hall elements 21*a* and 21*b*. A portion of the recess penetrates through the semiconductor substrate 10*a* except connecting parts E of the Hall element forming arrangements 21*ak* and 21*bk*. Here, the connecting part E of each Hall element forming arrangement 21*ak* or 21*bk* is thinner than an adjacent part of the Hall element forming arrangement 21*ak* or 21*bk*, which is adjacent to the connecting part E of the Hall element forming arrangement 21*ak* or 21*bk*. Furthermore, the relatively thin connecting part E of each Hall element forming arrangement 21*ak* or 21*bk* is plastically deformed, so that the Hall element forming arrangement 21*ak* or 21*bk* is disposed on the corresponding slant surface 10*bs* or 10*bt* of the base 10*b*.

In the magnetic sensor apparatus 101, the metal layer 6 is arranged over the semiconductor substrate 10*a* via the intermediate dielectric insulating layer 5. Wiring (electrical connecting line) formed of the metal layer 6 are connected to the Hall elements 21*a* and 21*b* across the connecting parts E. This metal layer 6 is preferably a copper (Cu) layer or a chromium (Cr)/gold (Au) stack layer (i.e., a chromium (Cr) and gold (Au) stack layer) that is high in conductivity and has flexibility and strength enough to endure even when it is bent at the connecting parts E.

A resin layer (alternatively, an oxide layer) 7 is laminated on the metal layer 6 at the connecting parts E. Thus, the metal layer 6 at the connecting parts E is reinforced with the laminated resin layer 7, and the strength of the connecting parts E can be enhanced. This resin layer 7 is preferably of polyimide (PI) that has the flexibility and strength enough to reinforce the metal layer 6 and to endure even when it is bent at the connecting parts E.

In the magnetic sensor apparatus 101, the thickness of the semiconductor substrate 10*a* at the connecting parts E is 0 µm. In other words, the semiconductor substrate 10*a* is eliminated in each connecting part E. Thus, each Hall element forming arrangement 21*ak* or 21*bk* and the corresponding portion of the semiconductor substrate 10*a* outside the recess are connected with each other only by the metal layer 6 and the resin layer 7 in the corresponding connecting part E. For this reason, the connecting parts E can be plastically deformed, and the Hall element forming arrangements 21*ak* and 21*bk* can be held on the slant surfaces 10*bs* and 10*bt* of the base 10*b*.

As mentioned above, the formation of the Hall elements 21*a* and 21*b* and the disposition of the Hall element forming arrangements 21*ak* and 21*bk* on the slant surfaces 10*bs* and 10*bt* of the base 10*b* can be performed by the conventional processing technique used in the manufacturing of the semiconductor devices.

Figure 16:
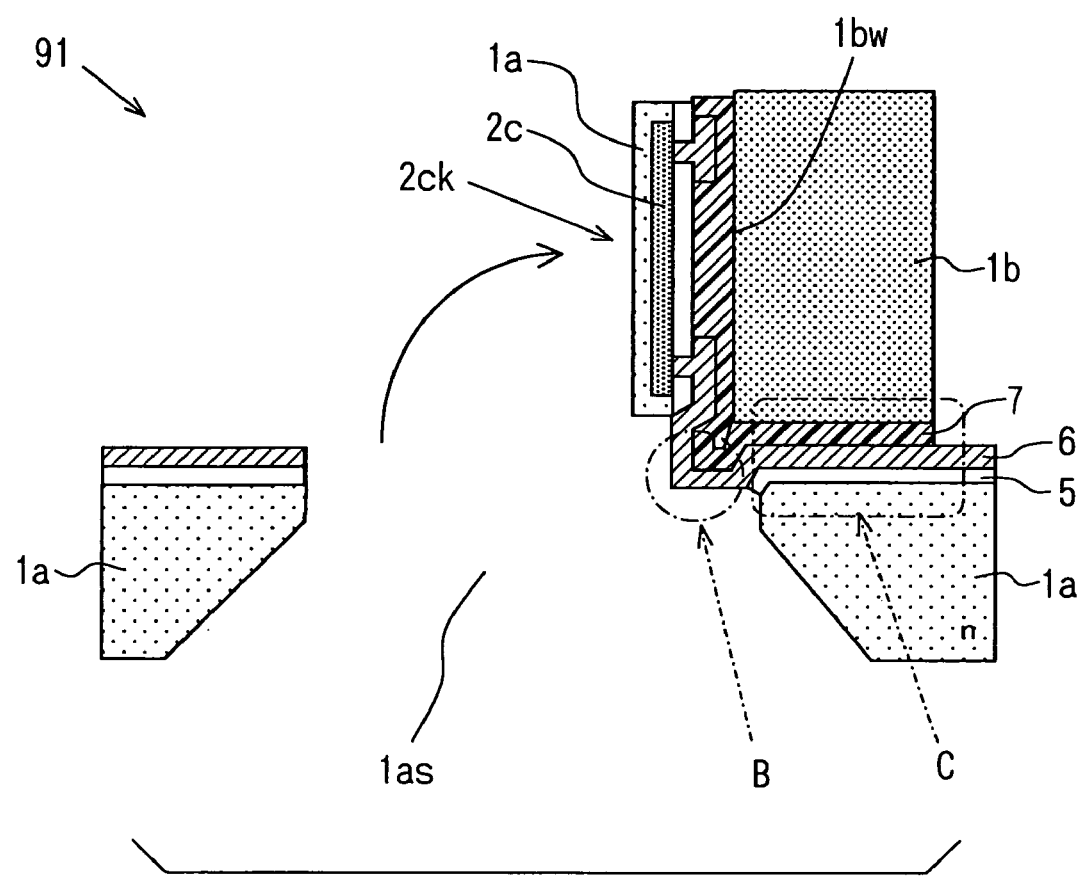
FIG. 16 is a sectional view illustrating another conventional magnetic sensor apparatus.

The magnetic sensor apparatus 101 of FIG. 4 is capable of detecting magnetic field components Ba and Bb of the rotating magnetic field Bo, which are direction to coincide with the plane directions, respectively, of the slant surfaces 10*bs* and 10*bt*. These magnetic field components Ba and Bb are detected using the two Hall elements 21*a* and 21*b* disposed on the slant surfaces 10*bs* and 10*bt* in different plane directions, respectively. Therefore, the magnetic sensor apparatus 101 can be used as described with reference to FIG. 1A to FIG. 3B. That is, the magnetic sensor apparatus 101 can be used as a rotational angle sensor capable of detecting the rotational angle of the rotating magnetic field Bo throughout 360 degree angular range. The two Hall elements 21a and 21b of the magnetic sensor apparatus 101 can be simultaneously formed, and they are uniform in characteristics such as offset and gain. Therefore, the magnetic sensor apparatus 101 is less prone to generate errors. As mentioned above, the base 10b is disposed on the rear surface side of the semiconductor substrate 10a. Therefore, the regions other than the Hall element forming arrangements 21ak and 21bk on the principal surface side of the semiconductor substrate 10a can be utilized for forming other elements. For this reason, the packaging efficiency of the semiconductor substrate 10a is higher than that of the magnetic sensor apparatus 91 shown in FIG. 16.

As mentioned above, the magnetic sensor apparatus 101 of FIG. 4 has the Hall elements 21a ad 21b disposed on the slant surfaces 10bs and 10bt. The magnetic sensor apparatus 101 is suitable for mass production and is highly accurate and less prone to generate errors.

Next, description will be given to a manufacturing method for the magnetic sensor apparatus 101 of FIG. 4.

FIGS. 5A to 11 are step-by-step sectional views illustrating the method for the manufacture of the magnetic sensor apparatus 101 of FIG. 4.

FIGS. 5A to 9C are sectional views illustrating the steps of processing the semiconductor substrate 10a in the magnetic sensor apparatus 101. These figures illustrate a Hall element preparing process. In this process, the Hall elements 21a and 21b are formed in the principal surface of the semiconductor substrate 10a.

Figure 5A:
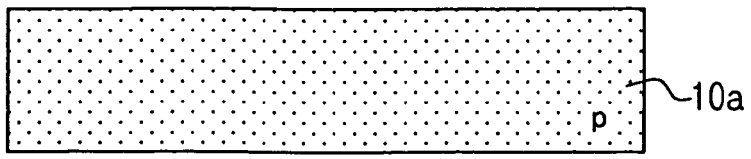
FIGS. 5A to 5E are step-by-step drawings showing a manufacturing method of the magnetic sensor apparatus shown in FIG. 4.

First, a p-type silicon (Si) substrate 10a having the {100} plane direction is prepared in the step in FIG. 5A. Alternatively, the plane direction of the Si substrate 10a may be {110} or {111}. The substrate concentration is about $2 \times 10^{15}/cm^3$, and the substrate thickness is about 250 µm.

Figure 5B:
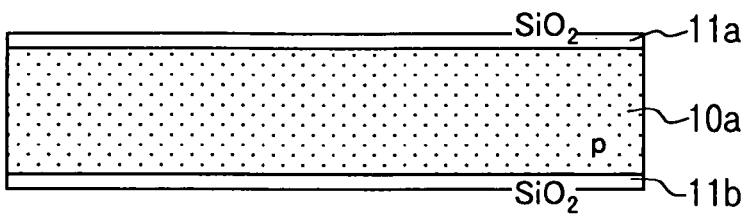

Next, oxide layers (SiO$_2$) 11a and 11b are formed by thermal oxidation in the step in FIG. 5B.

Figure 5C:
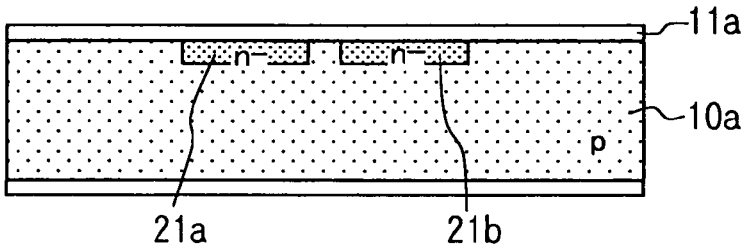

Next, the Hall elements 21a and 21b are formed in the step in FIG. 5C. The formation of the Hall elements 21a and 21b is carried out by forming a resist mask (not shown) over the oxide layer 11a, and ionically implanting an n-type impurity such as phosphorus (P). The formation of the resist mask can be carried out by patterning through a common photolithography technology. After the ion implantation, the Si substrate 10a is annealed at high temperature to diffuse the implanted n-type impurity.

Figure 5D:
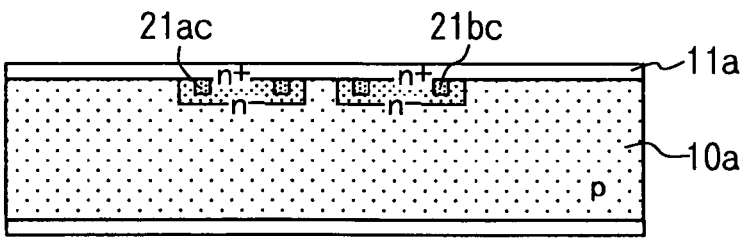

Next, electrodes 21ac and 21bc are formed to obtain desired ohmic characteristics in the step in FIG. 5D. For the formation of the electrodes 21ac and 21bc as well, the common photolithography technology is used. A new resist mask (not shown) is formed over the oxide layer 11a, and an n-type impurity such as arsenic (As) is ionically implanted at a high concentration. After the ion implantation, the Si substrate 10a is annealed at high temperature again to diffuse the implanted n-type impurity. In the illustration of the magnetic sensor apparatus 101 of FIG. 4, the graphic representation of the electrodes 21ac and 21bc is omitted for the sake of simplicity.

Figure 5E:
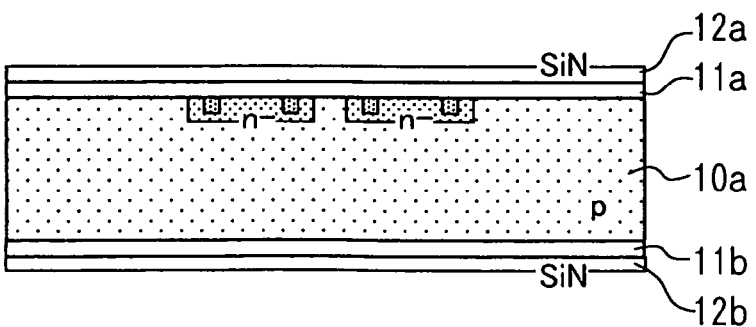

Next, nitride layers (SiN) 12a and 12b are formed on the oxide layers 11a and 11b, respectively, in the step in FIG. 5E. Oxide layers may be used in place of the nitride layers 12a and 12b.

Figure 6A:
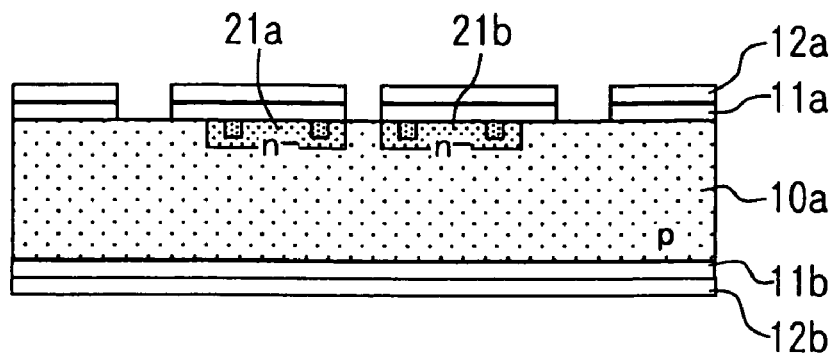
FIGS. 6A to 6C are further step-by-step drawings showing the manufacturing method.

Next, the oxide layer 11a and the nitride layer 12a are patterned by dry etching, and an etching mask is thereby formed in the step in FIG. 6A. This is done in order to form recesses on the principal surface side of the Si substrate 10a where the Hall elements 21a and 21b have been formed.

Figure 6B:
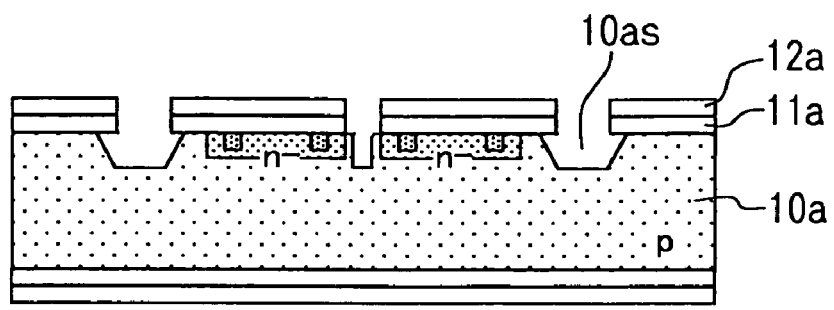

Next, wet etching is carried out using a TMAH (TetraMethyl Ammonium Hydroxide) or potassium hydroxide (KOH) aqueous solution in the step in FIG. 6B. Thus, recesses 10as are formed on the principal surface side of the Si substrate 10a.

Figure 6C:
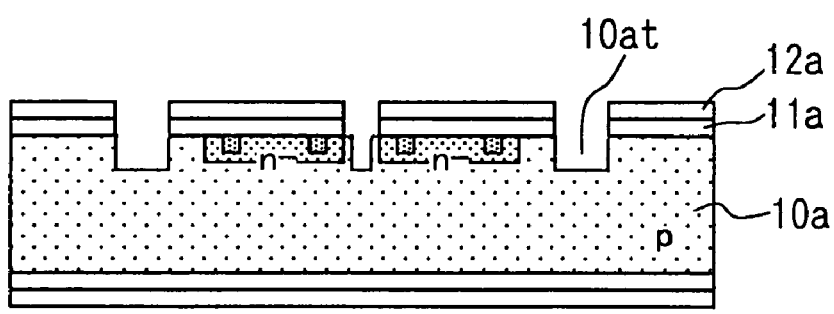

Alternative to the process shown in FIG. 6B, in order to reduce the occupied area of the entire recesses, the recesses 10at may be formed by dry etching without use of TMAH or KOH, as in the illustration of the step in FIG. 6C.

Figure 7A:
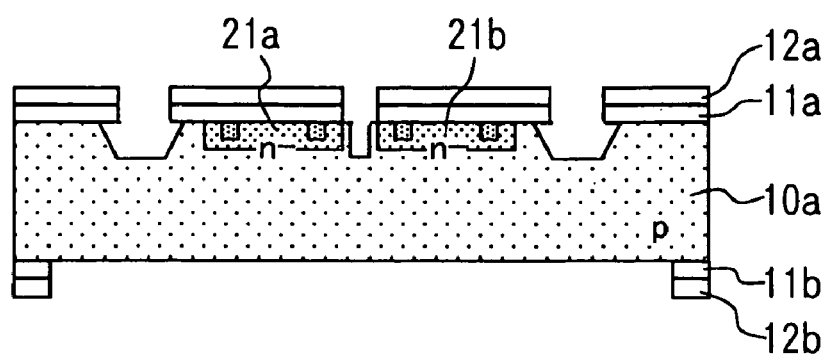
FIGS. 7A to 7C are further step-by-step drawings showing the manufacturing method.

Next, the oxide layer 11b and the nitride layer 12b are patterned by dry etching to form an etching mask in the step in FIG. 7A. This is done in order to form the recess on the rear surface side of the Si substrate 10a.

Figure 7B:
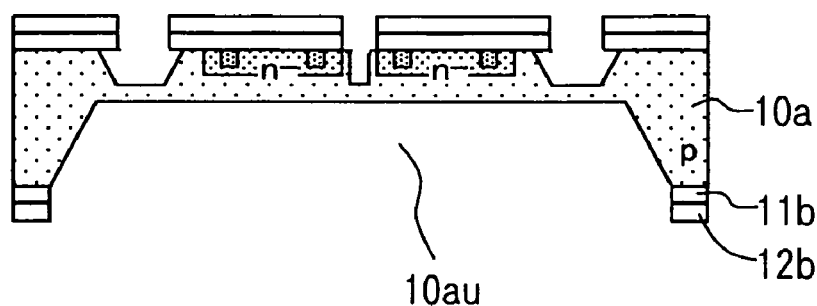

Next, wet etching is carried out using a TMAH or potassium hydroxide (KOH) aqueous solution to form the recess 10au on the rear surface side of the Si substrate 10a in the step in FIG. 7B. As illustrated in FIG. 7B, a size of the recess 10au in a plane parallel to the principal plane of the substrate 10a is greater than that of the Hall elements 21a and 21b, so that the outer peripheral part of the recess 10au extends around the Hall elements 21a and 21b in the plane parallel to the principal plane of the substrate 10a. Wet etching of the Si substrate 10a using a TMAH or potassium hydroxide (KOH) aqueous solution is anisotropic etching. Therefore, the end face and the slant surfaces of the recess 10au are crystal faces that are preferentially formed by anisotropic etching. For this reason, the end face and the slant surfaces of the recess 10au have specified exact angles. Before this wet etching, the entire principal surface side of the Si substrate 10a is masked with a resist or the like. However, the graphic representation of this mask is omitted for the sake of simplicity.

Figure 7C:
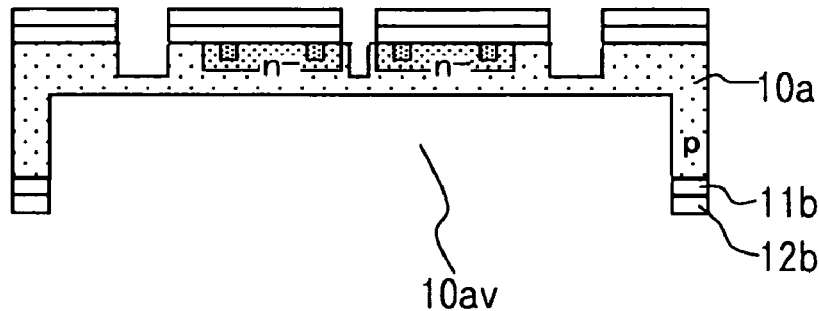

Alternative to the process shown in FIG. 7B, in order to reduce the occupied area of the recess, the recess 10av may be formed by dry etching or D-RIE (Deep Reactive Ion Etching) without use of TMAH or KOH, as in the illustration of the step in FIG. 7C.

Figure 8A:
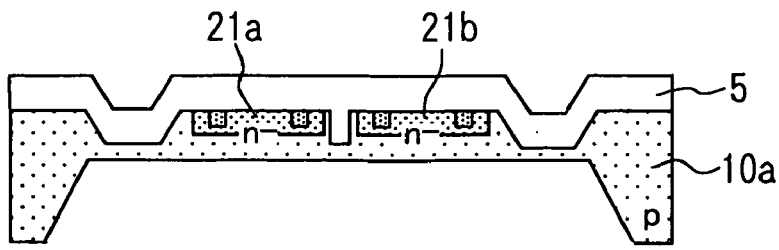
FIGS. 8A to 8E are further step-by-step drawings showing the manufacturing method.

Next, the oxide layers 11a and 11b and the nitride layers 12a and 12b are removed, and then the intermediate dielectric insulating layer 5 is formed on the principal surface side of the Si substrate 10a in the step in FIG. 8A. For the intermediate dielectric insulating layer 5, PSG (phospho-Silicate Glass), TEOS (Tetra-Ethyl Ortho-Silicate), or the like can be used.

Figure 8B:
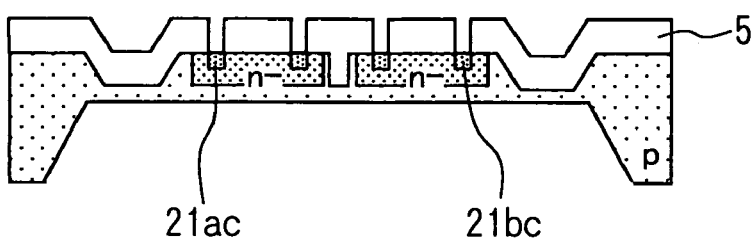

Next, contact holes are formed through the intermediate dielectric insulating layer 5 by etching to make electrical connections to the electrodes 21ac and 21bc of the Hall elements 21a and 21b in the step in FIG. 8B.

Figure 8C:
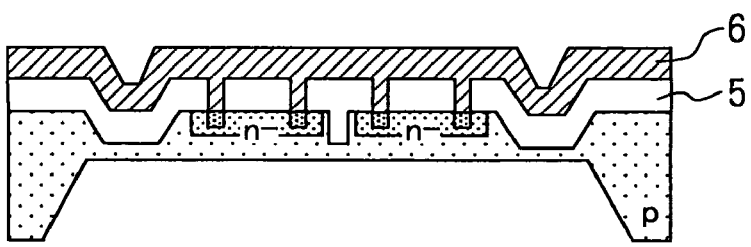

Next, the metal layer 6 is formed on the intermediate dielectric insulating layer 5, which has the contact holes, in the step in FIG. 8C. The metal layer 6 is, for example, a chromium (Cr)/gold (Au) stack layer obtained by forming a gold (Au) layer, 0.25 µm in thickness, over a chromium (Cr) layer, 0.05 µm in thickness, formed by sputtering or the like.

Figure 8D:
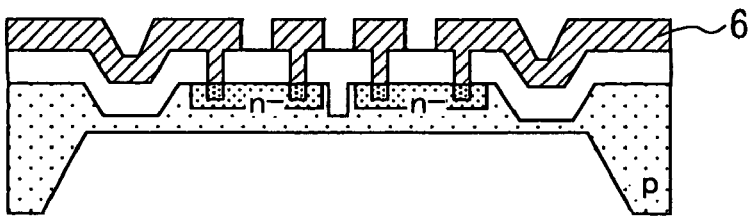

Next, the metal layer 6 is patterned by photolithography and etching in the step in FIG. 8D. Thus, a wiring pattern to be connected to the Hall elements 21a and 21b is obtained.

Figure 8E:
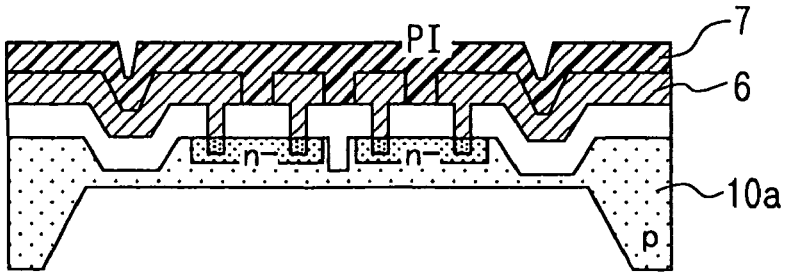

Next, the resin layer 7 of polyimide (PI) is formed on the metal layer 6 in the step in FIG. 8E. As mentioned above, the resin layer 7 is used to enhance the strength of the connecting parts E illustrated in FIG. 4 to protect the surface of the Si substrate 10a and to insulate the metal layer 6. In FIG. 4, the resin layer 7 is shown only on the connecting parts E for the sake of simplicity.

Figure 9A:
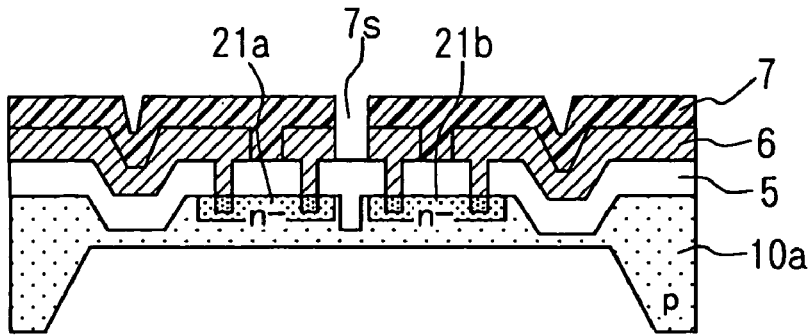
FIGS. 9A to 9C are further step-by-step drawings showing the manufacturing method.

Next, the resin layer 7 is etched to form a recess 7s to separate the Hall elements 21a and 21b from each other in the step in FIG. 9A.

Figure 9B:
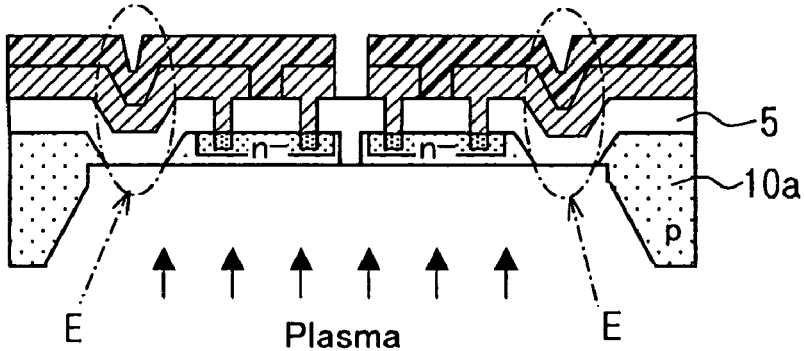

Next, the Si substrate 10a is subjected to plasma etching from the rear surface side until the intermediate dielectric insulating layer 5 is exposed at the connecting parts E in the step in FIG. 9B. Here, sulfur hexafluoride ($SF_6$) or the like can be used as the etching gas.

Figure 9C:
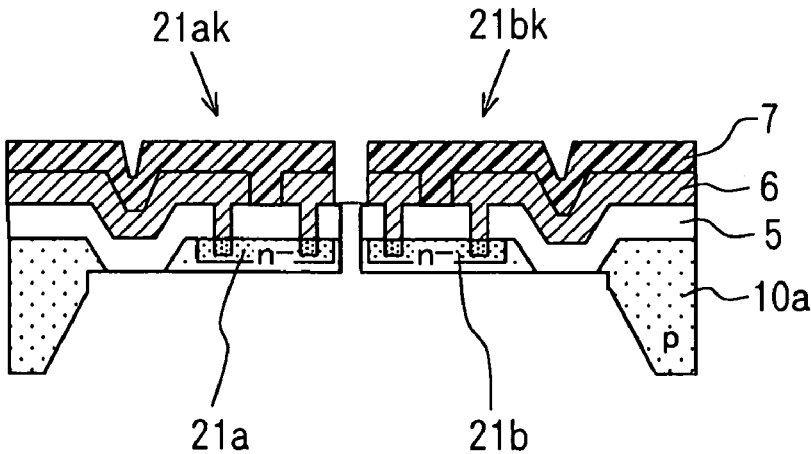

Last, the two Hall elements 21a and 21b are separated from each other by photolithography and etching to form the Hall element forming arrangements 21ak and 21bk in the step in FIG. 9C. This completes the processing of the Si substrate 10a as the Hall element preparing process.

FIGS. 10A to 10E are step-by-step sectional views illustrating the processing of the base 10b of the magnetic sensor apparatus 101 illustrated in FIG. 4. More specifically, FIGS. 10A to 10E illustrate the base preparing process for the base 10b having the slant surfaces 10bs and 10bt that are positioned in oblique directions relative to the holding surfaces, which hold the semiconductor substrate 10a.

Figure 10A:
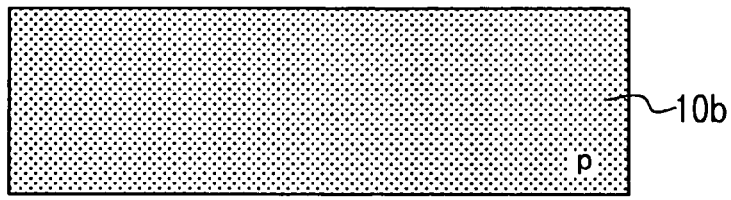
FIGS. 10A to 10E are further step-by-step drawings showing the manufacturing method.

First, a p-type silicon (Si) substrate 10b having the {100} plane direction is prepared in the step in FIG. 10A. The substrate concentration is about $2 \times 10^{15}/cm^3$, and the substrate thickness is about 500 μm.

Figure 10B:
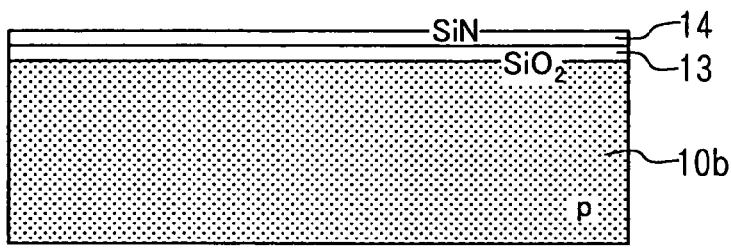

Next, an oxide layer ($SiO_2$) 13 is formed by thermal oxidation in the step in FIG. 10B. Thereafter, a nitride layer (SiN) 14 is formed on the oxide layer 13.

Figure 10C:
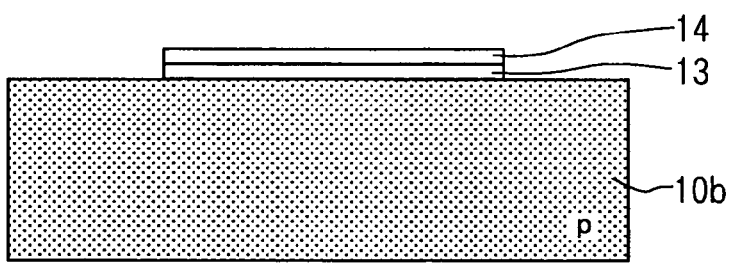

Next, the oxide layer 13 and the nitride layer 14 are patterned to obtain an etching mask for the formation of the slant surfaces in the step in FIG. 10C.

Figure 10D:
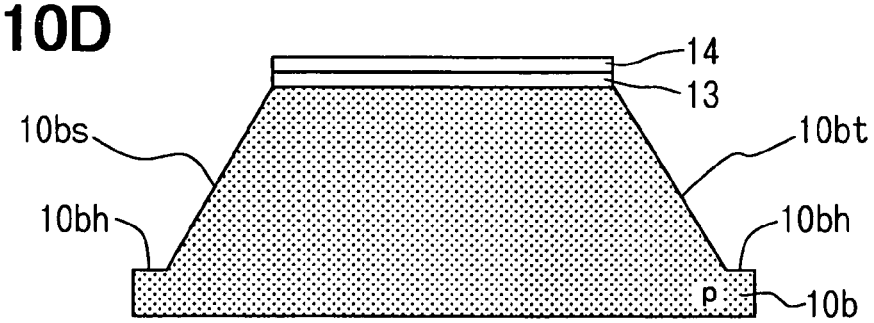

Next, wet etching is carried out using a TMAH or potassium hydroxide (KOH) aqueous solution in the step in FIG. 10D. At this time, the patterned oxide layer 13 and nitride layer 14 are used as a mask, and the slant surfaces 10bs and 10bt are formed on the Si substrate 10b. The etching end face 10bh becomes the holding surfaces 10bh for holding the semiconductor substrate 10a illustrated in FIG. 4.

The wet etching of the Si substrate 10b using the TMAH or potassium hydroxide (KOH) aqueous solution is the anisotropic etching. Therefore, the slant surfaces 10bs and 10bt and the holding surfaces 10bh are crystal faces that are preferentially formed by the anisotropic etching. For this reason, the slant surfaces 10bs and 10bt become slant surfaces having specified exact angles relative to the holding surfaces 10bh. Therefore, the magnetic sensor apparatus 101, which is manufactured by disposing the Hall elements 21a and 21b on the slant surfaces 10bs and 10bt in subsequent processes, is highly accurate and less prone to generate errors.

Figure 10E:
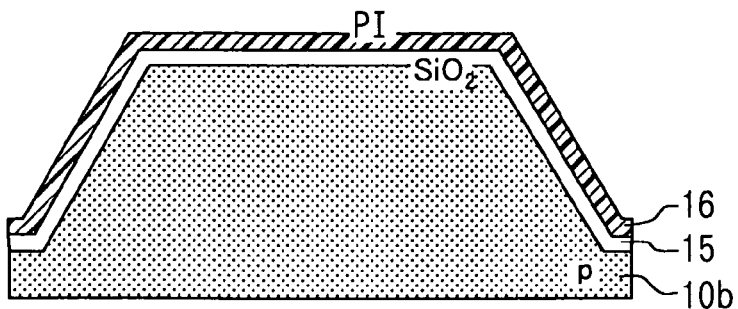

Next, the oxide layer 13 and the nitride layer 14 are removed by phosphoric acid or the like, and then thermal oxidation is carried out again to form an oxide layer ($SiO_2$) 15 in the step in FIG. 10E. Thereafter, polyimide 16 is formed on the oxide layer 15. In FIG. 4, the graphic representation of the oxide layer 15 and the polyimide 16 is omitted for the sake of simplicity.

This completes the processing of the Si substrate 10b of the base.

Figure 11:
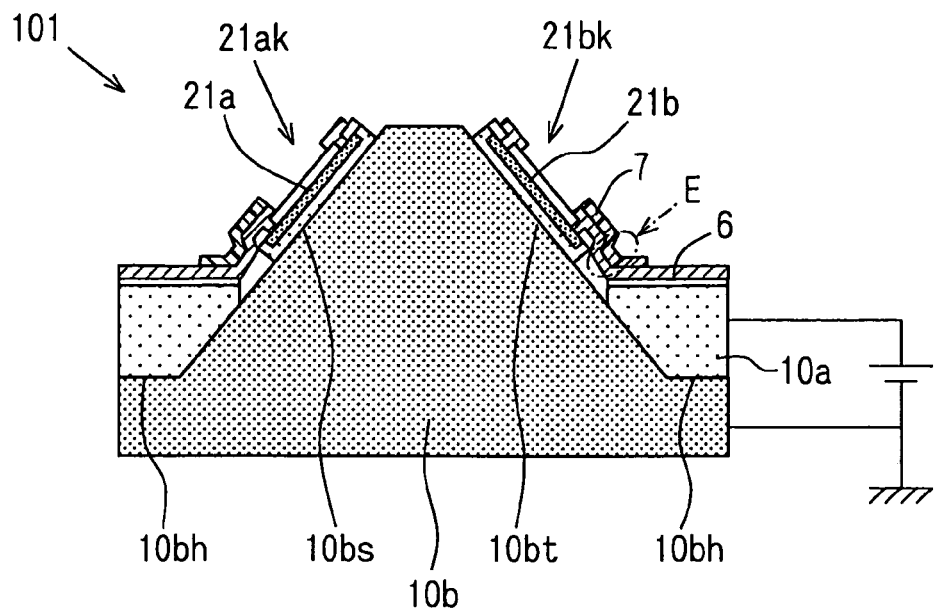
FIG. 11 is a sectional view showing the manufacturing method.

FIG. 11 is a sectional view illustrating a holding process. In this process, the Hall element forming arrangements 21ak and 21bk, which have the Hall elements 21a and 21b, and the Si substrate 10a are held, i.e., are secured on the Si substrate 10b, which serves as the base.

First, the Si substrate 10b prepared in the base preparing process, illustrated in FIGS. 10A to 10E, is disposed in place on the rear surface side of the Si substrate 10a prepared in the Hall element preparing process, illustrated in FIGS. 5A to 9C. Next, the Si substrate 10b is pushed up from the rear surface side of the Si substrate 10a. The metal layer 6 and the polyimide 7 are thereby deformed at the connecting parts E to dispose the Hall element forming arrangements 21ak and 21bk on the slant surfaces 10bs and 10bt of the Si substrate 10b. Next, the Si substrate 10a and the Si substrate 10b are brought into tight contact with each other by electrostatic force (applying 200V DC). Last, the entire work piece is heated (at 350° C. for 30 minutes) to join the polyimide 16, which is shown in the illustration of the step in FIG. 10E, as an intermediate layer between the substrate 10a and the substrate 10b.

This completes the manufacture of the magnetic sensor apparatus 101 having the Hall elements 21a and 21b disposed on the slant surfaces 10bs and 10bt, illustrated in FIG. 4.

The majority of the above-mentioned manufacturing method utilizes the common processing techniques for semiconductor devices. Therefore, the manufacturing method for the magnetic sensor apparatuses gives favorable throughput and is suitable for mass production as compared with the conventional manufacturing methods. In the conventional manufacturing method for the magnetic sensor apparatus 90, illustrated in FIGS. 15A and 15B, patterning is carried out by four times of electron beam exposure. With the manufacturing method of the present invention, as mentioned above, the magnetic sensor apparatus 101, which is less prone to generate errors, can be manufactured at low costs.

Figure 12:
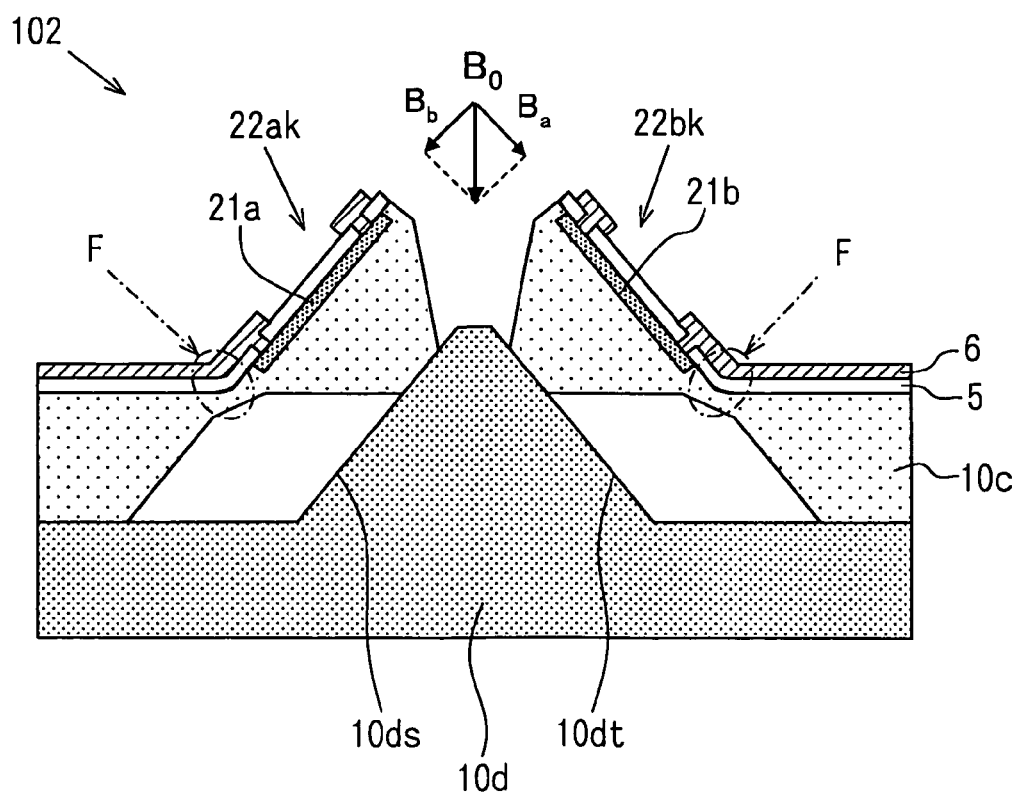
FIG. 12 is a sectional view illustrating a modification of the magnetic sensor apparatus.
Figure 13:
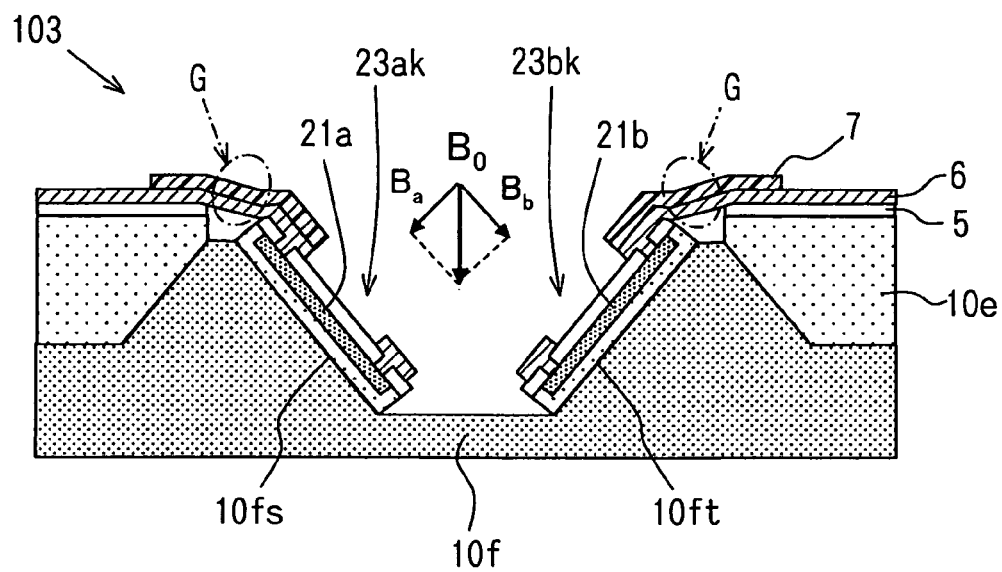
FIG. 13 is a sectional view illustrating another modification of the magnetic sensor apparatus.
Figure 14:
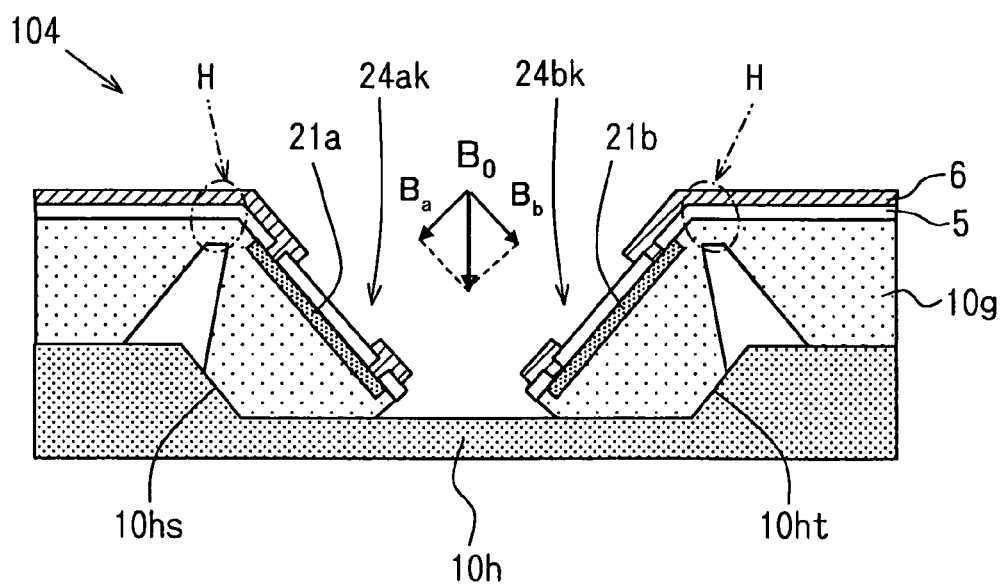
FIG. 14 is a sectional view illustrating another modification of the magnetic sensor apparatus.

FIGS. 12 to 14 are drawings showing modifications of the magnetic sensor apparatus of the above embodiment. In the illustrations of the magnetic sensor apparatuses 102 to 104 in FIGS. 12 to 14, the same members as in the magnetic sensor apparatus 101 in FIG. 4 will be marked with the same reference numerals.

Similar to the magnetic sensor apparatus 101, the magnetic sensor apparatus 102 in FIG. 12 includes two Hall element forming arrangements 22ak and 22bk and a base 10d. The Hall element forming arrangements 22ak and 22bk have the Hall elements 21a, 21b, respectively, which are disposed on a principal surface of a semiconductor substrate 10c. The base 10d is disposed on the rear surface side of the semiconductor substrate 10c and holds the Hall element forming arrangements 22ak and 22bk and the semiconductor substrate 10c. In the magnetic sensor apparatus 101 of FIG. 4, the portion under the Hall elements 21a and 21b is largely removed by etching. In the magnetic sensor apparatus 102 of FIG. 12, the unetched semiconductor substrate 10c, which have the original thickness, is left under each Hall element 21a, 21b. For this reason, the Hall element forming arrangements 22ak and 22bk are free from variation in thickness caused by etching. Further, the angle of disposition of the Hall element forming arrangements 22ak and 22bk on the slant surfaces 10ds and 10dt is accurate.

In the magnetic sensor apparatus 101 of FIG. 4, the semiconductor substrate 10a is completely etched at the connecting parts E, and its thickness is reduced to 0 μm. The Hall element forming arrangements 21a and 21bk and the portions of the semiconductor substrate 10a outside the recess are connected with each other only by the metal layer 6 and the resin layer 7. In the magnetic sensor apparatus 102 in FIG. 12, the thickness of the semiconductor substrate 10c at the connecting parts F is controlled to 20 μm or less, which permits relatively easy plastic deformation thereof. Thus, the semiconductor substrate 10c is thinly left at the connecting parts F. In the case of the magnetic sensor apparatus 102 of FIG. 12, the required strength of the connecting parts F can be ensured with the semiconductor substrate 10*c*. Therefore, it is unnecessary to specially provide the resin layer 7 of polyimide or the like, which is found in the magnetic sensor apparatus 101 in FIG. 4.

There is a commonality between the magnetic sensor apparatus 101 of FIG. 4 and the magnetic sensor apparatus 102 of FIG. 12. Specifically, the Hall element forming arrangements 21*ak*, 21*bk*, 22*ak*, 22*bk* are disposed on the slant surfaces 10*bs*, 10*bt*, 10*ds*, 10*dt* of the base 10*b*, 10*d* so that they are protruded from the rest of the principal surface of the semiconductor substrate 10*a*, 10*c* in the direction away from the base 10*b*, 10*d*.

The magnetic sensor apparatuses 103 and 104 in FIG. 13 and FIG. 14 are different in this regard. Specifically, the Hall element forming arrangements 23*ak*, 23*bk*, 24*ak*, 24*bk* are disposed on the slant surfaces 10*fs*, 10*ft*, 10*hs*, 10*ht* of the base 10*f*, 10*h* so that they are recessed or are caved in from the rest of the principal surface of the semiconductor substrate 10*e*, 10*g* toward the base 10*f*, 10*h*. The structure of the connecting parts G of the magnetic sensor apparatus 103 in FIG. 13 is the same as that of the connecting parts E of the magnetic sensor apparatus 101 in FIG. 4. The structure of the connecting parts H of the magnetic sensor apparatus 104 in FIG. 14 is the same as that of the connecting parts F of the magnetic sensor apparatus 102 in FIG. 12.

When the Hall element forming arrangements are protruded as in the magnetic sensor apparatuses 101 and 102, the following advantage is brought. That is, the Hall element forming arrangements 21*ak*, 21*bk*, 22*ak*, and 22*bk* can be easily held on the slant surfaces 10*bs*, 10*bt*, 10*ds*, and 10*dt*. When the Hall element forming arrangements are concavely disposed as in the magnetic sensor apparatuses 103 and 104 in FIG. 13 and FIG. 14, the following advantage is brought. That is, the Hall elements 21*a* and 21*b* are more favorably protected in comparison to the cases where the Hall element forming arrangements are protruded.

The magnetic sensor apparatuses 102 to 104 in FIGS. 12 to 14 also have the similar constitution as the magnetic sensor apparatus 101 in FIG. 4 with respect to the following points. That is, the semiconductor substrates 10*c*, 10*e*, and 10*g*, in which the Hall elements 21*a* and 21*b* are provided, are separately formed from the bases 10*d*, 10*f*, 10*h* over which the Hall elements 21*a* and 21*b* are finally disposed. Therefore, the magnetic sensor apparatuses 102 to 104 can also be made to have the Hall elements disposed on the slant surfaces and can be suitable for mass production and can be highly accurate and less prone to generate errors. It should be understood that the magnetic sensor apparatuses 102 to 104 can also be similarly manufactured using the manufacturing method illustrated in FIGS. 5A to 11.

(Other Modifications)

Each of the magnetic sensor apparatuses 101 to 104 illustrated in FIGS. 4 and 12 to 14 uses the base 10*b*, 10*d*, 10*f*, 10*h*, which has the single-crystal Si substrate. The base used in the magnetic sensor apparatus of the present invention is not limited to this and may be a base formed of any other material, such as metal. In the magnetic sensor apparatuses 101 to 104, the two Hall elements 21*a* and 21*b* are respectively formed in the same semiconductor substrate 10*a*, 10*c*, 10*e*, 10*g*. In the magnetic sensor apparatus of the present invention, the number of Hall elements formed in the same semiconductor substrate is not limited to two. One or any multiple number of Hall elements may be formed in the same semiconductor substrate.

Additional advantages and modifications will readily occur to those skilled in the art. The invention in its broader terms is therefore not limited to the specific details, representative apparatus, and illustrative examples shown and described.

What is claimed is:

1. A magnetic sensor apparatus comprising:
a semiconductor substrate;
at least one Hall element forming arrangement that is formed on the semiconductor substrate, wherein each of the at least one Hall element forming arrangement includes a Hall element that is formed in a principal surface of the semiconductor substrate; and
a base that is disposed at a rear surface of the semiconductor substrate and holds the semiconductor substrate and the at least one Hall element forming arrangement, wherein:
the base includes:
a holding surface, which holds the semiconductor substrate; and
at least one slant surface, which is slanted relative to the holding surface; and
each of the at least one Hall element forming arrangement is held on a corresponding one of the at least one slant surface of the base, wherein:
a recess is recessed in the rear surface of the semiconductor substrate;
the recess extends around the Hall element of each Hall element forming arrangement;
a portion of the recess penetrates through the semiconductor substrate except a connecting part of each Hall element forming arrangement;
the connecting part of each Hall element forming arrangement is thinner than an adjacent part of the Hall element forming arrangement, which is adjacent to the connecting part of the Hall element forming arrangement; and
the connecting part of each Hall element forming arrangement is plastically deformed to place the Hall element forming arrangement on the corresponding slant surface of the base.

2. The magnetic sensor apparatus according to claim 1, wherein: the at least one Hall element forming arrangement includes a plurality of Hall element forming arrangements; and the at least one slant surface of the base includes a plurality of slant surfaces, which have different plane directions, respectively, and which hold the plurality of Hall element forming arrangements, respectively.

3. The magnetic sensor apparatus according to claim 1, wherein each Hall element forming arrangement is recessed away from the rest of the principal surface of the semiconductor substrate toward the base.

4. The magnetic sensor apparatus according to claim 1, wherein: a metal layer is arranged over the semiconductor substrate via an intermediate dielectric insulating layer; and the metal layer is one of a copper (Cu) layer and a chromium (Cr) and gold (Au) stack layer.

5. The magnetic sensor apparatus according to claim 4, wherein one of a resin layer and an oxide layer is formed over the metal layer in the connecting part of each Hall element forming arrangement.

6. The magnetic sensor apparatus according to claim 5, wherein the thickness of the semiconductor substrate in the connecting part of each Hall element forming arrangement is 0 µm, so that the semiconductor substrate is eliminated from the connecting part of the Hall element forming arrangement, and the metal layer and the resin layer of the connecting part of the Hall element forming arrangement connects the Hall element forming arrangement to a corresponding outer portion of the semiconductor substrate, which is located outside of the recess.

7. The magnetic sensor apparatus according to claim 1, wherein a thickness of the semiconductor substrate in the connecting part of each Hall element forming arrangement is equal to or less than 20 μm.

8. The magnetic sensor apparatus according to claim 5, wherein the resin layer is made of polyimide.

9. A magnetic sensor apparatus comprising:
a semiconductor substrate;
at least one Hall element forming arrangement that is formed on the semiconductor substrate, wherein each of the at least one Hall element forming arrangement includes a Hall element that is formed in a principal surface of the semiconductor substrate; and
a base that is disposed at a rear surface of the semiconductor substrate and holds the semiconductor substrate and the at least one Hall element forming arrangement, wherein:
the base includes:
a holding surface, which holds the semiconductor substrate; and
at least one slant surface, which is slanted relative to the holding surface; and
each of the at least one Hall element forming arrangement is held on a corresponding one of the at least one slant surface of the base, wherein
each Hall element forming arrangement protrudes from the rest of the principal surface of the semiconductor substrate in a direction away from the base.

10. A manufacturing method for a magnetic sensor apparatus, the method comprising:
preparing at least one Hall element forming arrangement on a semiconductor substrate, wherein each of the at least one Hall element forming arrangement includes a Hall element that is formed in a principal surface of the semiconductor substrate;
preparing a base for holding the semiconductor substrate, wherein the base includes:
a holding surface, which holds the semiconductor substrate; and
at least one slant surface, which is slanted relative to the holding surface; and
holding the semiconductor substrate on the base upon disposing the base at a rear surface of the semiconductor substrate, so that each of the at least one Hall element forming arrangement is held on a corresponding one of the at least one slant surface of the base, wherein
the holding of the semiconductor substrate further includes positioning each Hall element forming arrangement in such a manner that the Hall element forming arrangement protrudes from the rest of the principal surface of the semiconductor substrate in a direction away from the base.

11. A magnetic sensor apparatus comprising:
a semiconductor substrate;
at least one Hall element forming arrangement that is formed on the semiconductor substrate, wherein each of the at least one Hall element forming arrangement includes a Hall element that is formed in a principal surface of the semiconductor substrate; and
a base that is disposed at a rear surface of the semiconductor substrate and holds the semiconductor substrate and the at least one Hall element forming arrangement, wherein:
the base includes:
a holding surface, which holds the semiconductor substrate; and
at least one slant surface, which is slanted relative to the holding surface; and
each of the at least one Hall element forming arrangement is held on a corresponding one of the at least one slant surface of the base, wherein:
the semiconductor substrate is a first semiconductor substrate; and the base is a second semiconductor substrate, which is formed separately from the first semiconductor substrate.

12. The magnetic sensor apparatus according to claim 11, wherein:
the second semiconductor substrate is a single-crystal silicon substrate; and each slant surface of the second semiconductor substrate is a crystal face of the single-crystal silicon substrate that is preferentially formed by anisotropic etching.

13. A manufacturing method for a magnetic sensor apparatus, the method comprising:
preparing at least one Hall element forming arrangement on a semiconductor substrate, wherein each of the at least one Hall element forming arrangement includes a Hall element that is formed in a principal surface of the semiconductor substrate;
preparing a base for holding the semiconductor substrate, wherein the base includes:
a holding surface, which holds the semiconductor substrate; and
at least one slant surface, which is slanted relative to the holding surface; and
holding the semiconductor substrate on the base upon disposing the base at a rear surface of the semiconductor substrate, so that each of the at least one Hall element forming arrangement is held on a corresponding one of the at least one slant surface of the base, wherein:
the preparing of the at least one Hall element forming arrangement includes forming a recess in the rear surface of the semiconductor substrate, wherein:
the recess extends around the Hall element of each Hall element forming arrangement;
a portion of the recess penetrates through the semiconductor substrate except a connecting part of each Hall element forming arrangement; and
the connecting part of each Hall element forming arrangement is thinner than an adjacent part of the Hall element forming arrangement, which is adjacent to the connecting part or the Hall element forming arrangement; and
the holding of the semiconductor substrate includes plastically deforming the connecting part of each Hall element forming arrangement to place the Hall element forming arrangement on the corresponding slant surface of the base.

14. The manufacturing method according to claim 13, wherein the preparing of the base includes anisotropically etching the base, which is made of a single-crystal silicon substrate, to form each slant surface of the base as a crystal face of the single-crystal silicon substrate.

15. The manufacturing method according to claim 13, wherein the preparing of the at least one Hall element forming arrangement further includes arranging a metal layer over the semiconductor substrate via an intermediate dielectric insulating layer in such a manner that an electrical connecting line, which is formed by the metal layer, extends through the connecting part of each Hall element forming arrangement and is connected to the Hall element of the Hall element forming arrangement.

16. The manufacturing method according to claim 15, wherein the preparing of the at least one Hall element forming arrangement further includes forming a resin layer over the metal layer in the connecting part of each Hall element forming arrangement.

17. The manufacturing method according to claim 16, wherein the preparing of the at least one Hall element forming arrangement further includes making a thickness of the semiconductor substrate in the connecting part of each Hall element forming arrangement equal to 0 µm, so that the semiconductor substrate is eliminated from the connecting part of the Hall element forming arrangement, and the metal layer and the resin layer of the connecting part of the Hall element forming arrangement connects the Hall element forming arrangement to a corresponding outer portion of the semiconductor substrate, which is located outside of the recess.

18. The manufacturing method according to claim 13, wherein the preparing of the at least one Hall element forming arrangement further includes making a thickness of the semiconductor substrate in the connecting part of each Hall element forming arrangement equal to or less than 20 µm.

19. The manufacturing method according to claim 13, wherein the holding of the semiconductor substrate further includes positioning each Hall element forming arrangement in such a manner that the Hall element forming arrangement is recessed away from the rest of the principal surface of the semiconductor substrate toward the base.

* * * * *